(12) United States Patent
Kim et al.

(10) Patent No.: US 12,420,348 B2
(45) Date of Patent: Sep. 23, 2025

(54) SOLDER REFLOW APPARATUS AND METHOD OF MANUFACTURING ELECTRONIC DEVICE

(71) Applicant: SAMSUNG ELECTRONICS CO., LTD., Suwon-si (KR)

(72) Inventors: Youngja Kim, Suwon-si (KR); Sunwon Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/748,513

(22) Filed: Jun. 20, 2024

(65) Prior Publication Data

US 2025/0033132 A1    Jan. 30, 2025

(30) Foreign Application Priority Data

Jul. 24, 2023    (KR) .................. 10-2023-0095911

(51) Int. Cl.
*B23K 3/00*    (2006.01)
*B23K 1/00*    (2006.01)
(Continued)

(52) U.S. Cl.
CPC ............ *B23K 3/085* (2013.01); *B23K 1/0016* (2013.01); *B23K 3/04* (2013.01); *B23K 2101/40* (2018.08);
(Continued)

(58) Field of Classification Search
CPC ........ B23K 3/085; B23K 3/04; B23K 1/0016; B23K 3/08; B23K 3/047; B23K 3/087;
(Continued)

(56) References Cited

U.S. PATENT DOCUMENTS

| | | | | |
|---|---|---|---|---|
| 3,947,240 A | * | 3/1976 | Pfahl, Jr. .............. | B23K 35/386 |
| | | | | 165/104.19 |
| 4,032,033 A | * | 6/1977 | Chu ...................... | B23K 1/015 |
| | | | | 134/108 |

(Continued)

FOREIGN PATENT DOCUMENTS

| | | | | |
|---|---|---|---|---|
| CA | 1073275 A | * | 3/1980 | ............. B23K 1/015 |
| CN | 111451592 A | * | 7/2020 | ............. B23K 1/008 |

(Continued)

*Primary Examiner* — Kiley S Stoner
(74) *Attorney, Agent, or Firm* — MORGAN, LEWIS & BOCKIUS LLP

(57) ABSTRACT

A solder reflow apparatus includes a vapor generating chamber configured to accommodate a heat transfer fluid and to be filled with saturated vapor generated when the heat transfer fluid is heated; a heater configured to heat the heat transfer fluid to generate saturated vapor; a substrate stage configured to be moved up and down within the vapor generating chamber and configured to support a substrate on which an electronic component is mounted via solder; a cleaning portion installed in an upper portion of the vapor generating chamber, wherein the cleaning portion is configured to spray a cleaning fluid onto the substrate on the substrate stage, wherein the cleaning fluid includes a material the same as the heat transfer fluid; and a guide structure configured to collect the cleaning fluid sprayed onto the substrate on the substrate stage and to direct the cleaning fluid to a reservoir that contains the heat transfer fluid.

20 Claims, 13 Drawing Sheets

(51) Int. Cl.
*B23K 3/04* (2006.01)
*B23K 3/08* (2006.01)
*B23K 101/40* (2006.01)
*H01L 23/00* (2006.01)

(52) U.S. Cl.
CPC .............. *H01L 24/13* (2013.01); *H01L 24/75* (2013.01); *H01L 24/81* (2013.01); *H01L 2224/13111* (2013.01); *H01L 2224/13139* (2013.01); *H01L 2224/13147* (2013.01); *H01L 2224/75* (2013.01); *H01L 2224/81815* (2013.01)

(58) Field of Classification Search
CPC ............ B23K 3/00; B23K 37/04–0452; B23K 1/008–015; B23K 2101/36–42; H01L 24/13; H01L 24/75; H01L 24/81; H01L 2224/13111; H01L 2224/13139; H01L 2224/13147; H01L 2224/75; H01L 2224/81815; H01L 24/97; H01L 21/561; H01L 24/16; H01L 2224/16227; H01L 2224/75272; H01L 2224/75804; H01L 2224/759; H01L 2224/7598; H01L 2224/75984; H01L 2224/81024; H01L 2224/81092; H01L 2224/81095; H01L 2224/81211; H01L 2224/81395; H01L 2224/81908; H01L 2224/95092; H01L 2224/97; H01L 2924/014; H01L 2924/20104; H01L 2924/20105; H01L 2924/20106; H01L 2224/75101; H01L 2224/75251; H01L 2224/75824; H01L 2224/8121; H01L 23/3121; H01L 2224/758; H01L 2224/75981; H05K 3/3494; H05K 2203/0736
USPC ... 228/179.1–180.22, 218–221, 42–43, 49.5, 228/234.2
See application file for complete search history.

(56) References Cited

U.S. PATENT DOCUMENTS

| | | | | |
|---|---|---|---|---|
| 4,055,217 A | * | 10/1977 | Chu | B23K 1/015 228/180.1 |
| 4,077,467 A | * | 3/1978 | Spigarelli | B23K 1/015 134/107 |
| 4,187,974 A | * | 2/1980 | Mahajan | B23K 1/015 219/439 |
| 4,373,658 A | * | 2/1983 | March | B23K 1/015 134/182 |
| 4,394,802 A | * | 7/1983 | Spigarelli | B23K 1/015 34/470 |
| 4,589,956 A | * | 5/1986 | Westby | B01D 5/0051 203/1 |
| 4,681,250 A | * | 7/1987 | Derrico | B23K 1/015 228/180.1 |
| 4,840,305 A | * | 6/1989 | Ankrom | B23K 3/06 228/180.1 |
| 4,850,117 A | * | 7/1989 | Venkat | B01D 5/0027 34/470 |
| 5,542,596 A | * | 8/1996 | Cimbak | B23K 1/015 228/234.2 |
| 7,380,699 B2 | | 6/2008 | Dokkedahl | |
| 7,748,600 B2 | | 7/2010 | Leicht | |
| 11,335,662 B2 | | 5/2022 | Karim et al. | |
| 11,355,362 B2 | | 6/2022 | Hirano et al. | |
| 2009/0173771 A1 | * | 7/2009 | Weber | B23K 1/008 228/46 |
| 2010/0170940 A1 | * | 7/2010 | Leicht | B23K 1/015 228/43 |
| 2010/0308103 A1 | * | 12/2010 | Chou | B23K 1/015 228/49.5 |
| 2011/0215483 A1 | * | 9/2011 | Zhang | B23K 1/008 257/E23.023 |
| 2013/0175323 A1 | * | 7/2013 | Zhang | B23K 1/206 228/4.1 |
| 2021/0046567 A1 | * | 2/2021 | Wild | B23K 1/015 |
| 2024/0047411 A1 | * | 2/2024 | Lee | B23K 3/08 |
| 2024/0120310 A1 | * | 4/2024 | Kim | H01L 24/83 |
| 2024/0128229 A1 | * | 4/2024 | Kang | H01L 24/75 |
| 2024/0178181 A1 | * | 5/2024 | Kim | H01L 24/81 |
| 2024/0293884 A1 | * | 9/2024 | Kim | H01L 21/56 |

FOREIGN PATENT DOCUMENTS

| | | | | |
|---|---|---|---|---|
| CN | 117506048 A | * | 2/2024 | ............ H01L 24/13 |
| DE | 102006025206 A1 | * | 12/2007 | ............ B23K 1/015 |
| DE | 202009015051 U1 | * | 2/2010 | ............ B23K 1/015 |
| DE | 202009014590 U1 | * | 3/2010 | ........... B23K 1/0016 |
| DE | 202009014591 U1 | * | 3/2010 | ........... B23K 1/0016 |
| DE | 102009049270 A1 | * | 4/2011 | ............ B23K 1/015 |
| EP | 0106295 A1 | * | 4/1984 | |
| EP | 0218391 A1 | * | 4/1987 | |
| EP | 0326539 A1 | * | 8/1989 | |
| EP | 0732982 B1 | | 8/1997 | |
| EP | 1870190 A1 | * | 12/2007 | ........... B23K 1/0016 |
| EP | 3556503 A1 | * | 10/2019 | ........... B23K 1/0016 |
| EP | 3851235 A1 | * | 7/2021 | ............ B23K 1/015 |
| GB | 2105208 A | * | 3/1983 | ............. B01D 3/00 |
| GB | 2159083 A | * | 11/1985 | ............ B23K 1/015 |
| JP | 61092779 A | * | 5/1986 | ............ B23K 1/015 |
| JP | 01166881 A | * | 6/1989 | ............ B23K 1/015 |
| JP | 01202362 A | * | 8/1989 | ............ B23K 1/015 |
| JP | 2010-0147112 | | 7/2010 | |
| JP | 3215188 U | | 3/2018 | |
| JP | 2019181544 A | * | 10/2019 | ........... B23K 1/0016 |
| KR | 900007617 Y1 | * | 8/1990 | |
| KR | 20-1998-0050039 A | | 10/1998 | |
| KR | 20140135592 A | * | 11/2014 | |
| KR | 10-2420880 B1 | | 7/2022 | |
| KR | 20240079125 A | * | 6/2024 | |
| RU | 2751016 C1 | * | 7/2021 | ........... B23K 1/0016 |
| TW | 201428867 A | * | 7/2014 | ............ B23K 3/0623 |
| WO | WO-8604533 A1 | * | 8/1986 | |
| WO | WO-8904234 A1 | * | 5/1989 | |
| WO | WO-9515831 A1 | * | 6/1995 | ............ B08B 7/0064 |
| WO | WO-2005087422 A1 | * | 9/2005 | ............ B23K 1/015 |
| WO | WO-2007137547 A1 | * | 12/2007 | ............ B23K 1/008 |
| WO | WO-2010066002 A1 | * | 6/2010 | ............ B23K 1/008 |
| WO | WO-2011024813 A1 | * | 3/2011 | ........... B23K 1/0008 |
| WO | WO-2012035143 A1 | * | 3/2012 | ............. F26B 21/14 |
| WO | WO-2014148634 A1 | * | 9/2014 | ........... B23K 1/0016 |

* cited by examiner

FIG. 14
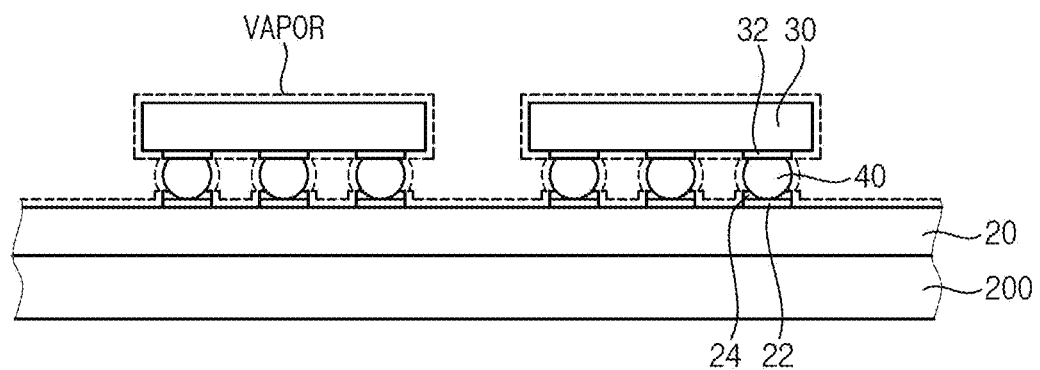
FIG. 15
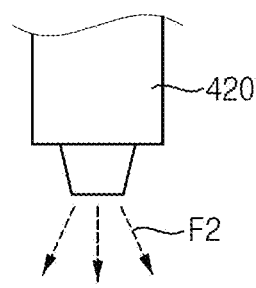
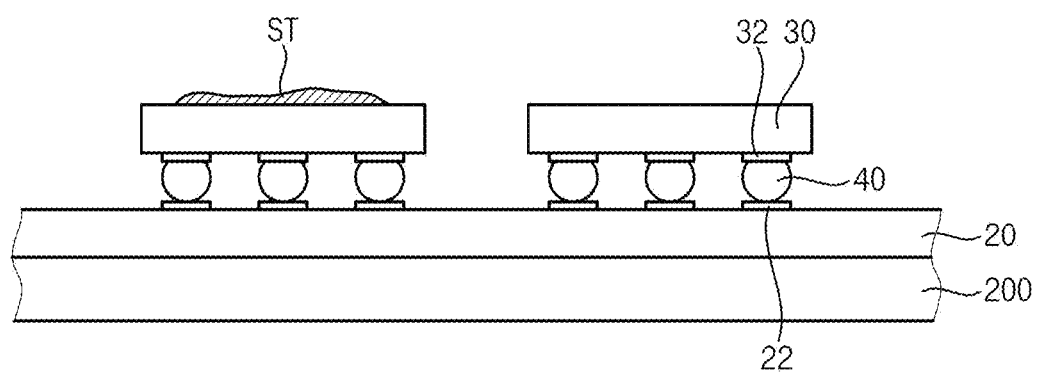

SOLDER REFLOW APPARATUS AND METHOD OF MANUFACTURING ELECTRONIC DEVICE

CROSS-REFERENCE TO RELATED APPLICATION

This application claims priority under 35 U.S.C. § 119 to Korean Patent Application No. 10-2023-0095911, filed on Jul. 24, 2023 in the Korean Intellectual Property Office (KIPO), the disclosure of which is incorporated by reference herein in its entirety.

1. Technical Field

Example embodiments relate to a solder reflow apparatus and a method of manufacturing an electronic device using the same. More particularly, example embodiments relate to a solder reflow apparatus using a vapor phase soldering method and a method of manufacturing an electronic device using the same.

2. Discussion of the Related Art

In the field of surface mount technology (SMT), a reflow process using a vapor phase soldering method may be performed to solder a solder member such as a solder ball. While performing the solder reflow process, a heat transfer fluid may be condensed from a gaseous state to a liquid state on a surface of a substrate such as a printed circuit board (PCB) or an electronic component on the substrate. During the condensation, stains may develop on the surface, resulting in poor quality in appearance.

SUMMARY

According to example embodiments, a solder reflow apparatus includes a vapor generating chamber configured to accommodate a heat transfer fluid and to be filled with saturated vapor generated when the heat transfer fluid is heated; a heater configured to heat the heat transfer fluid within the vapor generating chamber; a substrate stage configured to move up and down within the vapor generating chamber and configured to support a substrate on which an electronic component is mounted via solders; and a cleaning portion disposed in a cooling region of the vapor generating chamber, wherein the cleaning portion includes a fluid shielding cover that is configured to cover the substrate on the substrate stage when the substrate stage is in the cooling region to form a cleaning space, and a spray nozzle configured to spray a cleaning fluid onto the substrate in the cleaning space.

According to example embodiments, a solder reflow apparatus includes a vapor generating chamber configured to accommodate a heat transfer fluid and to be filled with saturated vapor generated when the heat transfer fluid is heated; a heater configured to heat the heat transfer fluid to generate saturated vapor; a substrate stage configured to be moved up and down within the vapor generating chamber and configured to support a substrate on which an electronic component is mounted via solder; a cleaning portion installed in an upper portion of the vapor generating chamber, wherein the cleaning portion is configured to spray a cleaning fluid onto the substrate on the substrate stage, wherein the cleaning fluid includes a material the same as the heat transfer fluid; and a guide structure configured to collect the cleaning fluid sprayed onto the substrate on the substrate stage and to direct the cleaning fluid to a reservoir that contains the heat transfer fluid.

According to example embodiments, a solder reflow apparatus includes a vapor generating chamber configured to accommodate a heat transfer fluid and to be filled with saturated vapor generated when the heat transfer fluid is heated; a heater configured to heat the heat transfer fluid; a substrate stage configured to be moved up and down within the vapor generating chamber and configured to support a substrate on which an electronic component is mounted via solders; a fluid shielding cover provided in a cooling region of the vapor generating chamber, wherein the fluid shielding cover includes an upper shielding portion extending in a horizontal direction to cover the substrate on the substrate stage in the cooling region and a vertical shielding portion extending in a vertical direction from the upper shielding portion to form a cleaning space; and a spray nozzle configured to spray a cleaning fluid onto the substrate within the cleaning space.

BRIEF DESCRIPTION OF THE DRAWINGS

Example embodiments will be more clearly understood from the following detailed description taken in conjunction with the accompanying drawings. FIGS. 1 to 17 represent non-limiting, example embodiments as described herein.

FIG. 1 is a cross-sectional view illustrating a solder reflow apparatus in accordance with example embodiments.

FIGS. 2 and 3 are side views illustrating the solder reflow apparatus of FIG. 1.

FIG. 4 is a cross-sectional view illustrating an article being cleaned by a cleaning portion of the solder reflow apparatus of FIG. 1.

FIG. 5 is a cross-sectional view illustrating a solder reflow apparatus in accordance with example embodiments.

FIG. 6 is a cross-sectional view illustrating a solder reflow apparatus in accordance with example embodiments.

FIG. 7 is a cross-sectional view illustrating a cleaning portion of a solder reflow apparatus in accordance with example embodiments.

FIG. 8 is a flowchart illustrating a method of manufacturing an electronic device in accordance with example embodiments.

FIG. 9 is a flowchart illustrating detailed steps of a substrate cleaning process of FIG. 8.

FIGS. 10, 11, 12, 13, 14, 15, 16, and 17 are views illustrating a method of manufacturing an electronic device in accordance with example embodiments.

DETAILED DESCRIPTION OF EXAMPLE EMBODIMENTS

Hereinafter, example embodiments will be explained in detail with reference to the accompanying drawings.

Figure 1:
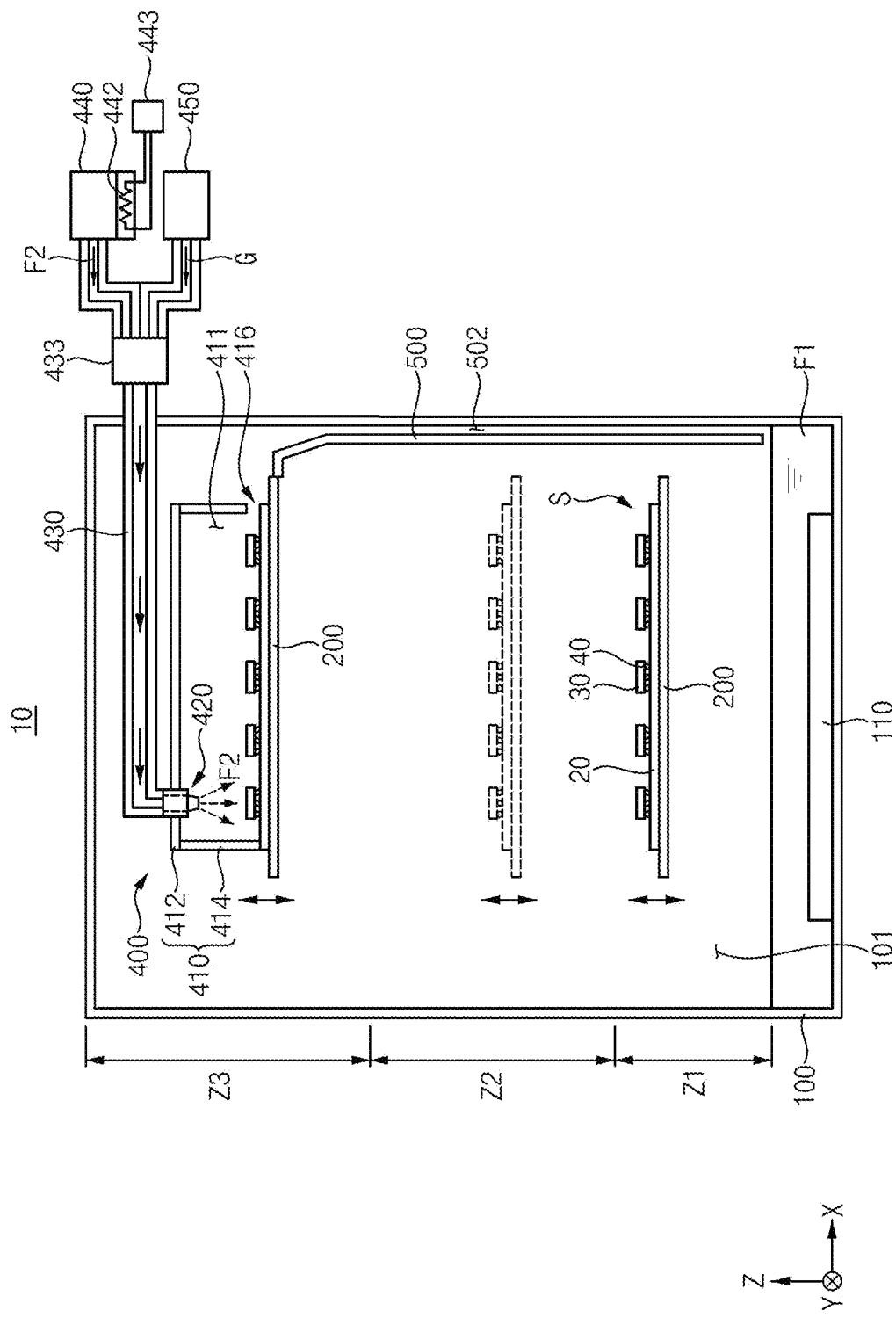
Figure 2:
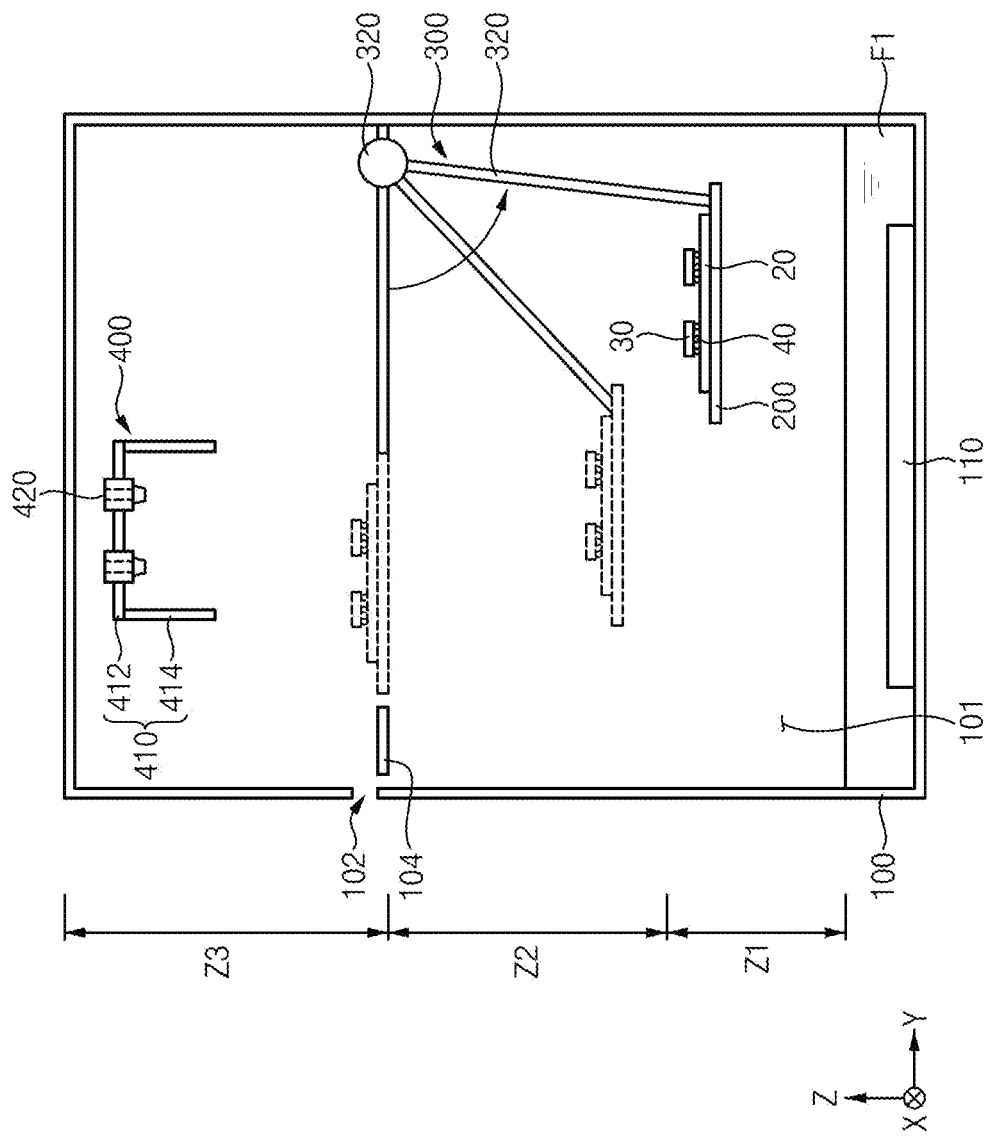
Figure 3:
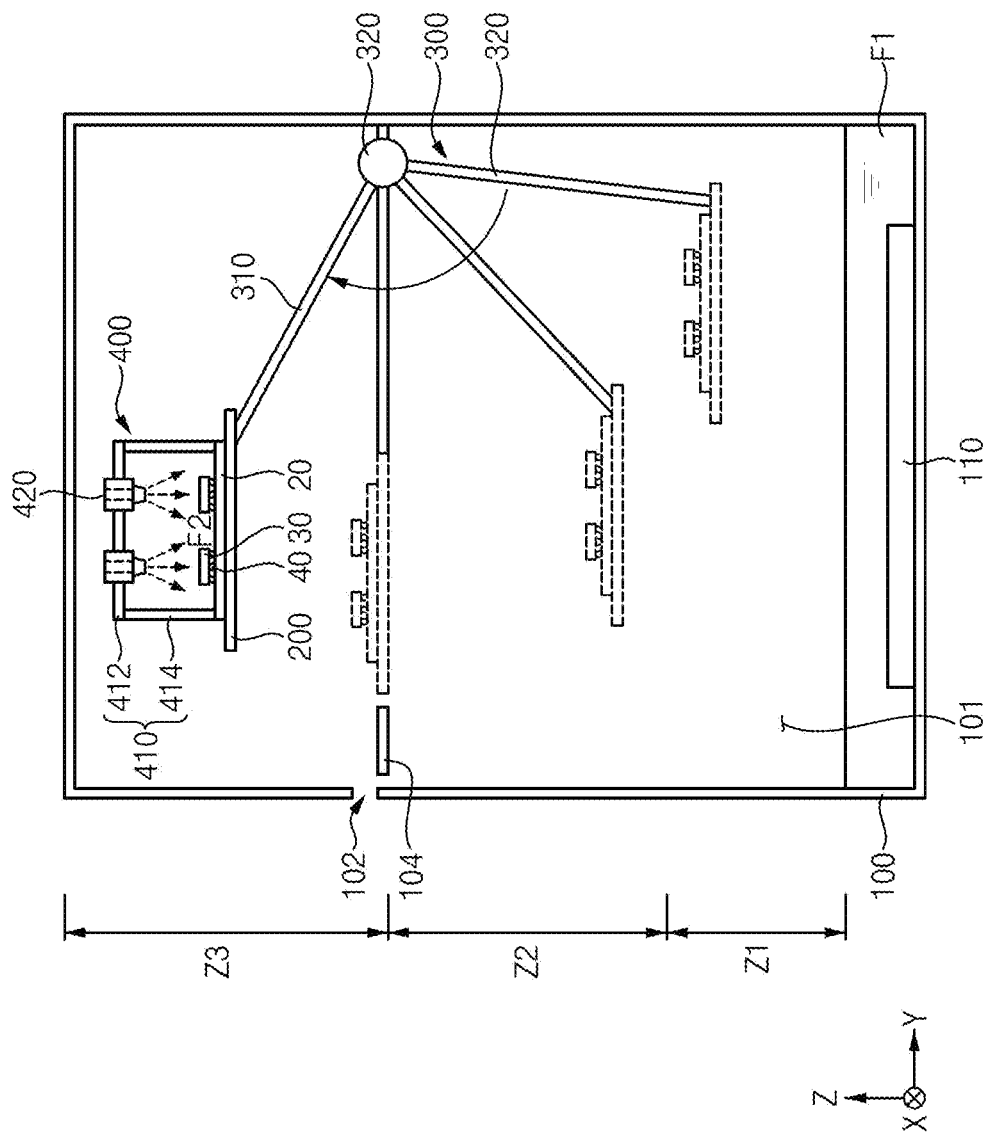
Figure 4:
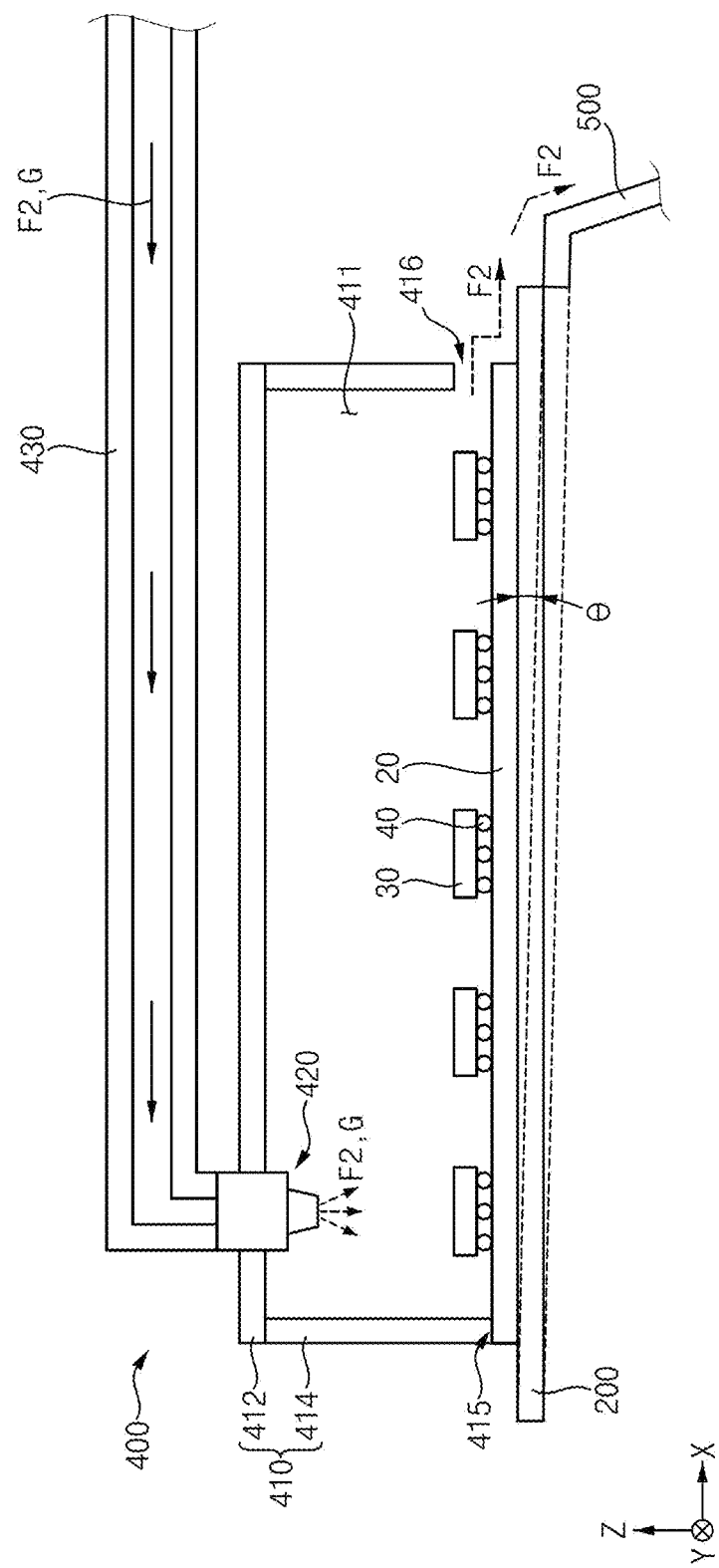

FIG. 1 is a cross-sectional view illustrating a solder reflow apparatus in accordance with example embodiments. FIGS. 2 and 3 are side views illustrating the solder reflow apparatus of FIG. 1. FIG. 2 is a side view illustrating the article that is loaded into and soldered in a vapor generating chamber of FIG. 1, and FIG. 3 is a side view illustrating the article that is moved to and cleaned by the cleaning portion of FIG. 1. FIG. 4 is a cross-sectional view illustrating an article being cleaned by a cleaning portion of the solder reflow apparatus of FIG. 1.

Referring to FIGS. 1 to 4, a solder reflow apparatus 10 may include a vapor generating chamber 100, a heater 110, a substrate stage 200, a vertical transfer portion 300, and a cleaning portion 400. In addition, the solder reflow apparatus 10 may further include a controller configured to control operations of the vertical transfer portion 300, a temperature sensing portion configured to monitor temperature in the vapor generating chamber 100, and a camera portion configured to inspect an appearance of a solder article, etc.

In example embodiments, the solder reflow apparatus 10 may be a vapor phase soldering apparatus configured to solder a solder paste 24 or a solder member by saturated vapor heated in the vapor generating chamber 100.

The vapor generating chamber 100 may include a lower reservoir having an oven shape to accommodate a heat transfer fluid F1 and to provide a space 101 filled with vapor that is generated directly above the fluid when the fluid F1 is boiling. The oven shape may refer to a shape where a small rectangular rack-shaped heater 110 is placed within a larger rectangular structure, the vapor generating chamber 100 at the bottom. The vapor generating chamber 100 may extend in a vertical direction (Z direction) by a predetermined height. In the vapor generating chamber 100, the heat transfer fluid F1 may boil, with the vapor rising to the top. Subsequently, the vapor may condense back into a liquid state at the top and then flow black down to the reservoir at the bottom.

The pressure inside the vapor generating chamber 100 may be maintained at atmospheric pressure. In some embodiments, the vapor generating chamber 100 may be connected to an exhaust device such as a vacuum pump to adjust the pressure inside the vapor generating chamber 100. The pressure inside the vapor generating chamber 100 may be maintained at a predetermined pressure to change the boiling point of the heat transfer fluid F1 or soldering environments.

The heat transfer fluid F1 may be a chemical material that provides the vapor for vapor phase soldering. The heat transfer fluid F1 may be selected in consideration of boiling point, environmental influences, and corrosiveness of the generated vapor. The heat transfer fluid F1 may include an inert organic liquid such as a perfluoropolyether (PFPEs)-based Galden solution. The boiling point of the Galden solution may be 230° C.

The heater 110 may heat the heat transfer fluid F1 accommodated in the vapor generating chamber 100 to generate saturated vapors. The heater 110 may include an electrical resistor that is immersed in the heat transfer fluid F1 on the bottom of the vapor generating chamber 100. In some embodiments, the heater 110 may include a resistor in the form of a coil surrounding the reservoir.

In addition, a heater may be installed on a sidewall of the vapor generating chamber 100 to control the temperature of the vapor generating chamber 100 during a reflow process.

In example embodiments, the substrate stage 200 may support an article S on which a solder process is performed in the vapor generating chamber 100. The substrate stage 200 may include a support structure for supporting the article S. The support structure may be a mesh type, a fork type or a plate type. The mesh type support structure may include support wires that define a plurality of openings through which the vapor moves. For example, the article S may include a substrate 20 on which an electronic component 30 is mounted via solders 40. The substrate 20 may be a printed circuit board (PCB) strip in which a plurality of PCBs are integrally provided. However, the substrate 20 might not be necessarily limited to the PCB strip. For example, the substrate 20 may be an individual PCB of a package unit, wafer or die that are to be separated into individual units through a sawing process.

In example embodiments, the vertical transfer portion 300 may move the at least one substrate stage 200 upward and downward within the vapor generating chamber 100. The vertical transfer portion 300 may include a transfer arm 310 that is rotatable upward and downward. A first end portion of the transfer arm 310 may support the substrate stage 200. A second end portion of the transfer arm 310 opposite to the first portion may be connected to a drive shaft 320. The drive shaft 320 may be rotatable by a drive source such as a drive motor. When the drive shaft 320 rotates, the first end portion of the transfer arm 310 may move upward and downward within the vapor generating chamber 100.

In some embodiments, the vertical transfer portion 300 may include various types of elevating drivers such as a transfer rail, a transfer screw, a transfer belt, etc., for raising and lowering the substrate stage 200. In this case, the substrate stage 200 may be supported by transfer rods, and the substrate stage 200 may be raised and lowered by the elevating driver.

As illustrated in FIG. 2, the article S for soldering may be transferred into the vapor generating chamber 100, and the article S may be moved to a first zone Z1. The first zone Z1 may be a reflow region. The article S may be transferred into the vapor generating chamber 100 through a gate 102 of the vapor generating chamber 100, and the article S may be loaded on the substrate stage 200 by a transfer mechanism 104 such as a guide rail or a transport pusher. After the article S is loaded, the Galden solution may be heated by the heater 110 and start to boil. The saturated vapor from the Galden solution may be distributed within the space 101 of the vapor generating chamber 100. At this time, the density of the saturated vapor may vary depending on the height of the vapor generating chamber 100, and thus a temperature gradient may be formed.

In example embodiments, the vapor generating chamber 100 may be divided into a first zone Z1, a second zone Z2 and a third zone Z3 according to the height. The third zone Z3, which is the highest space, may be a cooling region to be maintained at a first temperature T1, the second zone Z2 may be a preheating region to be maintained at a second temperature T2 higher than the first temperature T1, and the first zone Z1, which is the lowest space, may be the reflow region to be maintained at a third temperature T3 higher than the second temperature T2. The temperatures in the first to third zones Z1, Z2, and Z3 may be determined in proportion to the vapor densities in each zone.

For example, the temperature T1 may be 100° C., the temperature T2 may be 170° C., and the temperature T3 may be 230° C. The temperatures in the first to third zones Z1, Z2, and Z3 may be determined in consideration of a temperature profile of soldering. The solder 40 may include Sn—Ag—Cu (SAC) solder, Sn—Ag solder, etc. Since the boiling point of the SAC solder is 217° C., the third temperature T3 at the first zone Z1, which is the reflow region, may be maintained at 230° C.

Then, the transfer arm 310 may rotate downward so that the article S may be moved to the second zone Z2 and activated (soaked). The substrate 20 may be preheated to prevent various soldering defects and to provide a more solid and conductive joint. There may be a secondary vapor phase which is produced at a cooler temperature than the main vapor layer in the third and second zones Z3 and Z2. No soldering takes place in the second zone Z2, only a temperature rises.

Then, as the transfer arm 310 rotates further downward, the article S may be moved to the first zone Z1 so that the solder 40 may be reflowed. When the article S is immersed in the vapor in the first zone Z1, the vapor may serve as a heat transfer medium. Since the temperature of the vapor and the temperature of the substrate 20 in the first zone Z1 are different from each other, vapor may be condensed on a surface of the article S to form a layer. The vapor condensing on the surface may transfer latent heat to the surface of the substrate 20 during condensation to reflow the solder 40.

As illustrated in FIG. 3, after the solder 40 is soldered, the transfer arm 310 may rotate upward so that the article S moves to the second zone Z2 and the third zone Z3 and then may be cooled. Accordingly, the solder joints may be cooled down and solidified. At this time, stains ST may occur on the surface of the substrate 20 or the electronic component 30 on the substrate 20 due to the condensation of the heat transfer fluid F1. In order to remove these stains ST, the transfer arm 310 may be further rotated upward so that the article S is moved into a cleaning space 411 of the cleaning portion 400 that is installed in the third zone Z3, the cooling region, within the vapor generating chamber 100.

In example embodiments, the cleaning portion 400 may be installed within the third zone Z3 within the vapor generating chamber 100 and may spray a cleaning fluid F2 onto the surface of the article S on the substrate stage 200 that is raised into the third zone Z3. The cleaning portion 400 may include a fluid shielding cover 410 and at least one spray nozzle 420. The fluid shielding cover 410 may define the cleaning space 411 by covering the substrate 20 on the substrate stage 200 raised into the third zone Z3. For example, the fluid shielding cover 410 may be disposed on the substrate stage 200. The spray nozzle 420 may spray the cleaning fluid F2 onto the substrate 20 within the cleaning space 411. The cleaning portion 400 may further include a fluid passage 430 that is connected to the spray nozzle 420 and is configured to transfer the cleaning fluid F2. The cleaning portion 400 may also include a fluid supply 440 that connects to the fluid passage 430 and that supplies the cleaning fluid F2 to the fluid passage 430.

The fluid shielding cover 410 may include an upper shielding portion 412 that extends in a horizontal direction (XY direction) to cover the substrate 20 and a vertical shielding portion 414 that extends in a downward vertical direction (Z direction) from the upper shielding portion 412 to form the cleaning space 411. The fluid shielding cover 410 may include a durable material such as stainless steel, ceramic, etc., but is not necessarily limited thereto.

The at least one spray nozzle 420 may be installed in the upper shielding portion 412. A discharge hole of the spray nozzle 420 may protrude from a bottom surface of the upper shielding portion 412. For example, the spray nozzle 420 may include a fluid supply channel that extends along one direction and is configured to supply the fluid, and at least one discharge port that is connected to the fluid supply channel and is configured to spray the fluid. In some embodiments, the spray nozzle 420 may include a nozzle bar that extends in one direction and a plurality of spaced apart spray holes arranged along the length of the nozzle bar.

The fluid passage 430 may extend in the horizontal direction above the upper shielding portion 412 within the vapor generating chamber 100. An end portion, e.g., a first end, of the fluid passage 430 may penetrate a sidewall of the vapor generating chamber 100 and may be connected to the fluid supply 440 through a sealing connection member 432. The other end, e.g., a second end, portion of the fluid passage 430 may be connected to the spray nozzle 420 provided in the upper shielding portion 412. For example, the spray nozzle 420 may face the upper surface of the substrate 20 on the substrate stage 200. The cleaning fluid F2 supplied from the fluid supply 440 may flow through the fluid passage 430 to be supplied to the spray nozzle 420, and the spray nozzle 420 may spray the cleaning fluid F2 onto the substrate 20 in the cleaning space 411 to remove stains ST on the surface of the substrate 20 or the surface of the electronic component 30.

In example embodiments, the cleaning fluid F2 may include the same fluid as the heat transfer fluid F1. The cleaning fluid F2 sprayed through the spray nozzle 420 of the cleaning portion 400 may flow back to a reservoir that contains the heat transfer fluid F1 within the vapor generating chamber 100. The solder reflow apparatus 10 may further include a guide structure 500 that collects the cleaning fluid F2 sprayed onto the substrate 20 on the substrate stage 200 and directs the cleaning fluid F2 to the reservoir containing the heat transfer fluid F1. The guide structure 500 may extend in the vertical direction to be spaced apart from an inner wall of the vapor generating chamber 100 to define a discharge passage 502.

As illustrated in FIG. 4, when the substrate stage 200 is raised and positioned within the cleaning space 411 of the fluid shielding cover 410, a contact portion 415 of the vertical shielding cover 414 may contact at least a portion of the upper surface of the substrate 20. Since the contact portion 415 of the vertical shielding cover 414 contacts the upper surface of the substrate 20, the cleaning space 411 of the fluid shielding cover 410 may be sealed. For example, a sealing member such as an O-ring may be provided in a portion of the contact portion 415.

Additionally, an outlet portion 416 may be provided so that there is a space between the vertical shielding cover 414 and the upper surface of the substrate 20. Accordingly, the cleaning fluid F2 sprayed onto the substrate 20 may be discharged through the outlet portion 416. The cleaning fluid F2 sprayed onto the substrate 20 on the substrate stage 200 may be collected into the guide structure 500 through the outlet portion 416 of the vertical shielding cover 414, and the collected cleaning fluid F2 may be stored in the reservoir containing the heat transfer fluid F1 through the discharge passage 502.

In this case, the substrate stage 200 may be tilted by a preset angle $\theta$ with respect to a first horizontal direction (e.g., X direction). When the substrate stage 200 is tilted by the present angle $\theta$, the cleaning fluid F2 sprayed onto the substrate 20 on the substrate stage 200 may be collected into the guide structure 500, and the collected cleaning fluid F2 may be stored in the reservoir containing the heat transfer fluid F1, through the discharge passage 502.

In example embodiments, the cleaning potion 400 may further include a heater 442 that heats the cleaning fluid F2 in the fluid supply 440 within a preset temperature range. For example, the preset temperature range may range from 70° C. to 110° C. The heater 442 may include a heating wire for heating the cleaning fluid F2 in a storage tank of the fluid supply 440. The heater 442 may be connected to a power supply 443.

In example embodiments, the cleaning portion 400 may further include a gas supply 450 that supplies a gas G for drying the cleaning fluid F2 sprayed into the cleaning space 411. The gas supply 450 may be connected to the fluid passage 430 through the sealing connection member 432. The gas G supplied from the gas supply 450 may flow through the fluid passage 430 to be supplied to the spray nozzle 420, and the spray nozzle 420 may supply the gas G onto the substrate 20 in the cleaning space 411 to dry the cleaning fluid F2 on the substrate 20. For example, the gas G may include nitrogen $N_2$, air, etc.

In some embodiments, the cleaning portion 400 may include a gas injection nozzle provided in the upper shielding portion 412 and a gas passage that connected to the gas injection nozzle. The gas G from the gas supply 450 may flow through the gas passage to be supplied to the gas injection nozzle through the gas passage, and the gas injection nozzle may spray the gas onto the substrate 20 within the cleaning space 411.

As mentioned above, the solder reflow apparatus 10 may include the cleaning portion 400 that is installed in the third zone Z3 in the vapor generating chamber 100 and is configured to spray the cleaning fluid F2 on the article S on the substrate stage 200 raised into the third zone Z3 after soldering is performed. The cleaning portion 400 may spray the cleaning fluid F2 on the surface of the substrate 20 or the electronic component 30 on the substrate 20 to remove stains ST remaining due to the condensation of the heat transfer fluid F1.

In addition, the cleaning fluid F2 may include the same fluid as the heat transfer fluid F1, and the sprayed cleaning fluid F2 may be reused for the solder reflow process of the vapor phase soldering method.

Accordingly, there is no need to perform a cleaning process in a separate space after the solder reflow process. Therefore, package manufacturing processes may be performed efficiently and defects in appearance inspection may be prevented.

Figure 5:
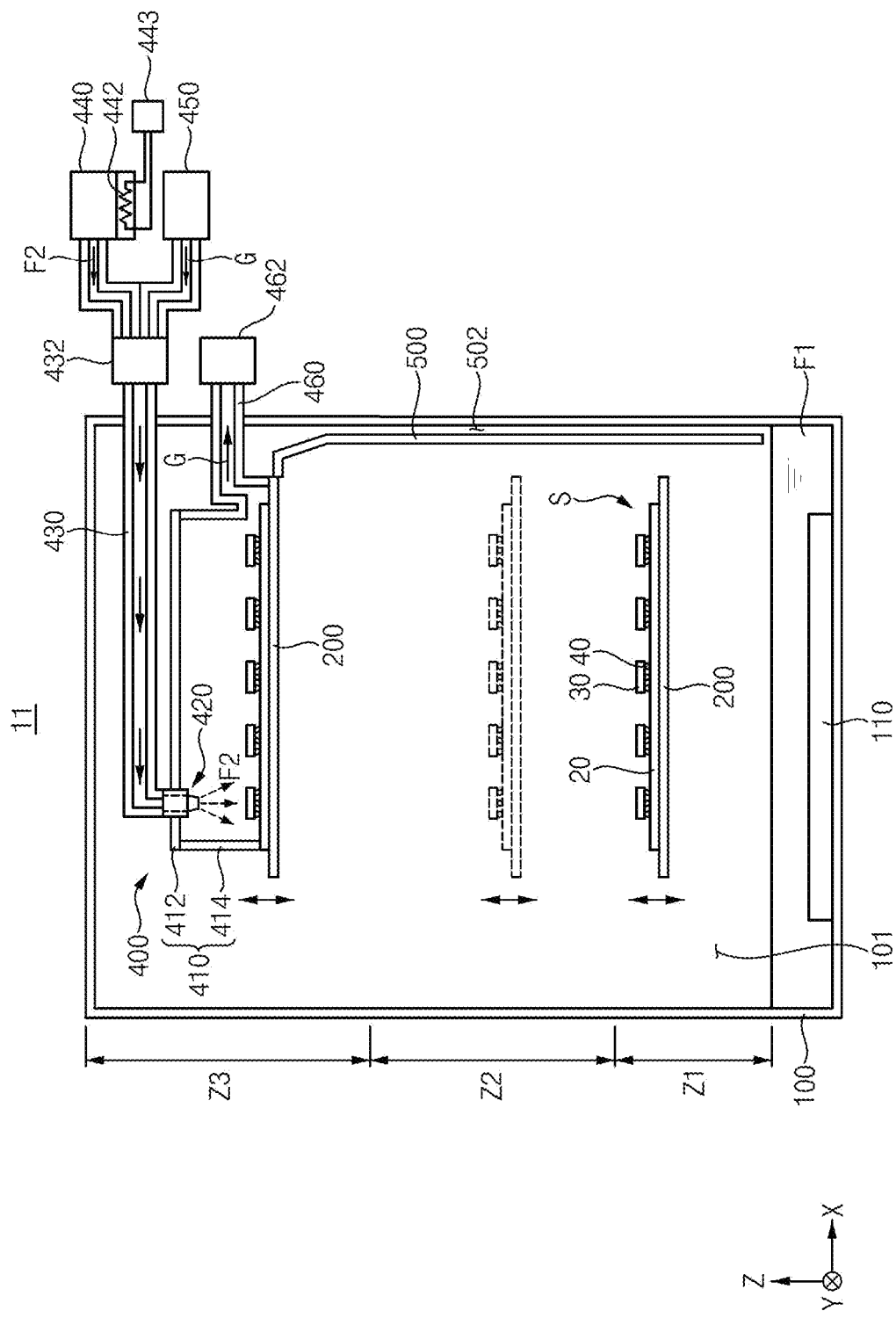

FIG. 5 is a cross-sectional view illustrating a solder reflow apparatus in accordance with example embodiments. The solder reflow apparatus of FIG. 5 may be substantially the same as the solder reflow apparatus described with reference to FIGS. 1 to 4 except for an additional configuration of a gas exhaust portion. Thus, same reference numerals may be used to refer to the same or like elements and any further repetitive explanation concerning the above elements will be omitted.

Referring to FIG. 5, a cleaning portion 400 of a solder reflow apparatus 11 may further include a gas exhaust portion that collects a gas G supplied into a cleaning space 411 and discharges the gas G from a vapor generating chamber 100 to the outside.

In example embodiments, the gas exhaust portion of the cleaning portion 400 may include a gas passage 460 connected to the cleaning space 411, and an exhaust pump 462 connected to the gas passage 460 that exhausts the gas G to the outside of the vapor generating chamber 100.

The gas passage 460 may extend from a fluid shielding cover 410 in a horizontal direction. An end portion, e.g., a first end, of the gas passage 460 may penetrate a sidewall of the vapor generating chamber 100 to be connected to the exhaust pump 462. When the substrate stage 200 is raised and is positioned within the cleaning space 411 of the fluid shielding cover 410, another end portion, e.g., a second end, of the gas passage 460 may be in communication with an outlet portion 416 of the fluid shielding cover 410. At this time, the gas G in the cleaning space 411 may be sucked in through the outlet portion 416 by the exhaust pump 462 and then may flow through the gas passage 460 to be discharged to the outside.

Figure 6:
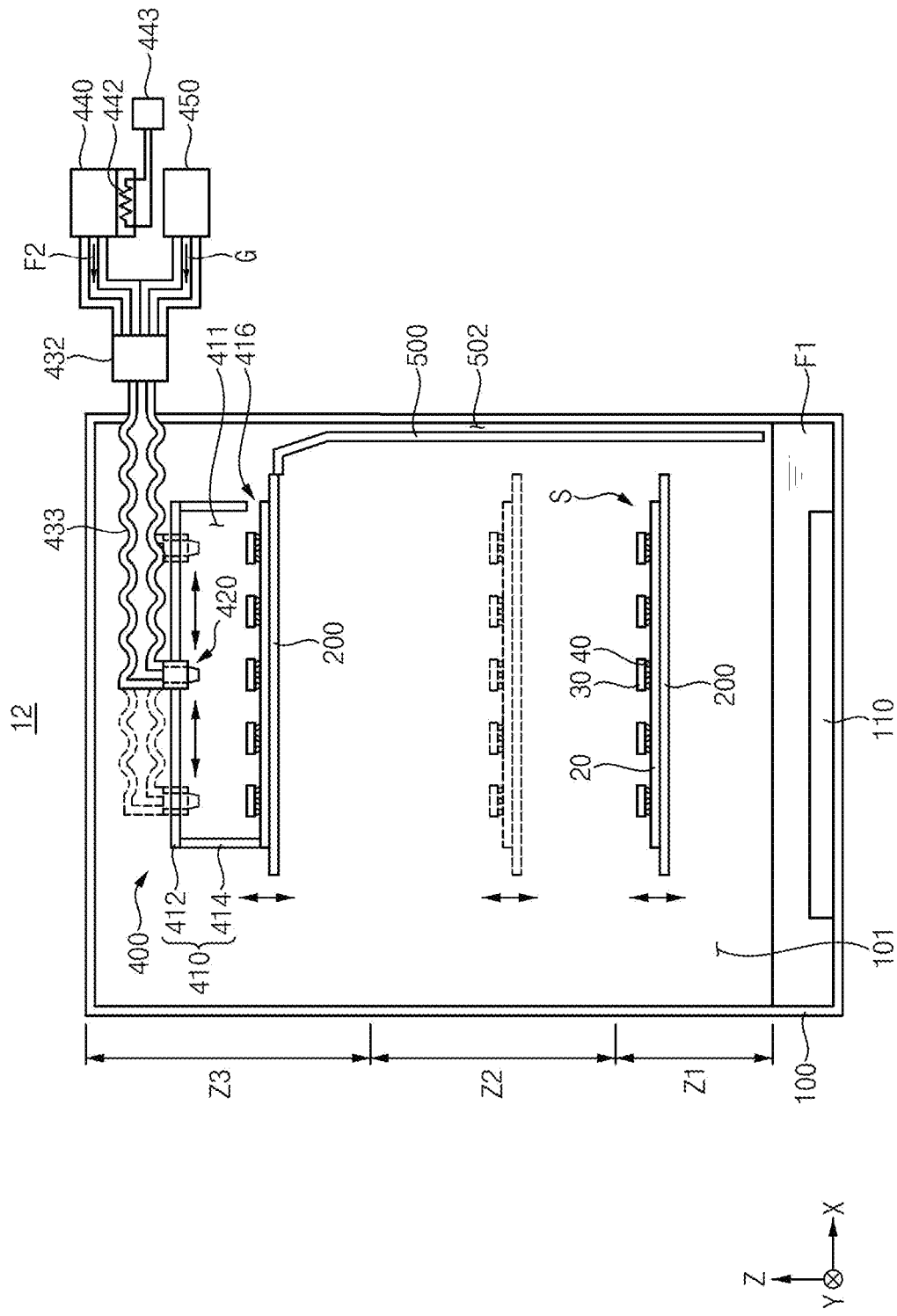

FIG. 6 is a cross-sectional view illustrating a solder reflow apparatus in accordance with example embodiments. The solder reflow apparatus of FIG. 6 may be substantially the same as the solder reflow apparatus described with reference to FIGS. 1 to 4 except for configurations of a spray nozzle and a fluid passage. Thus, same reference numerals may be used to refer to the same or like elements and any further repetitive explanation concerning the above elements will be omitted.

Referring to FIG. 6, a cleaning portion 400 of a solder reflow apparatus 12 may include a spray nozzle 420 that is movable in a horizontal direction within a fluid shielding cover 410.

In example embodiments, the spray nozzle 420 may be installed to be movable in an upper shielding portion 412 of the fluid shielding cover 410 in a first direction (e.g., X direction). The spray nozzle 420 may be movable in the first direction by a transfer mechanism such as a guide rail or a transfer screw installed on the upper shielding portion 412 of the fluid shielding cover 410.

The spray nozzle 420 may be connected to an expandable fluid passage 433. The expandable fluid passage 433 may include a bellows. An end portion, e.g., a first end, of the expandable fluid passage 433 may penetrate a sidewall of the vapor generating chamber 100 to be connected to a gas supply 450 through a sealing connection member 432. Another end portion, e.g., a second end, of the fluid passage 433 may be connected to a spray nozzle 420 provided in the upper shielding portion 412 of the fluid shielding cover 410. The spray nozzle 420 may be moved to a target location on the substrate 20, for example, a spotty defect location. As the spray nozzle 420 moves, the expandable fluid passage 433 may expand or contract.

Figure 7:
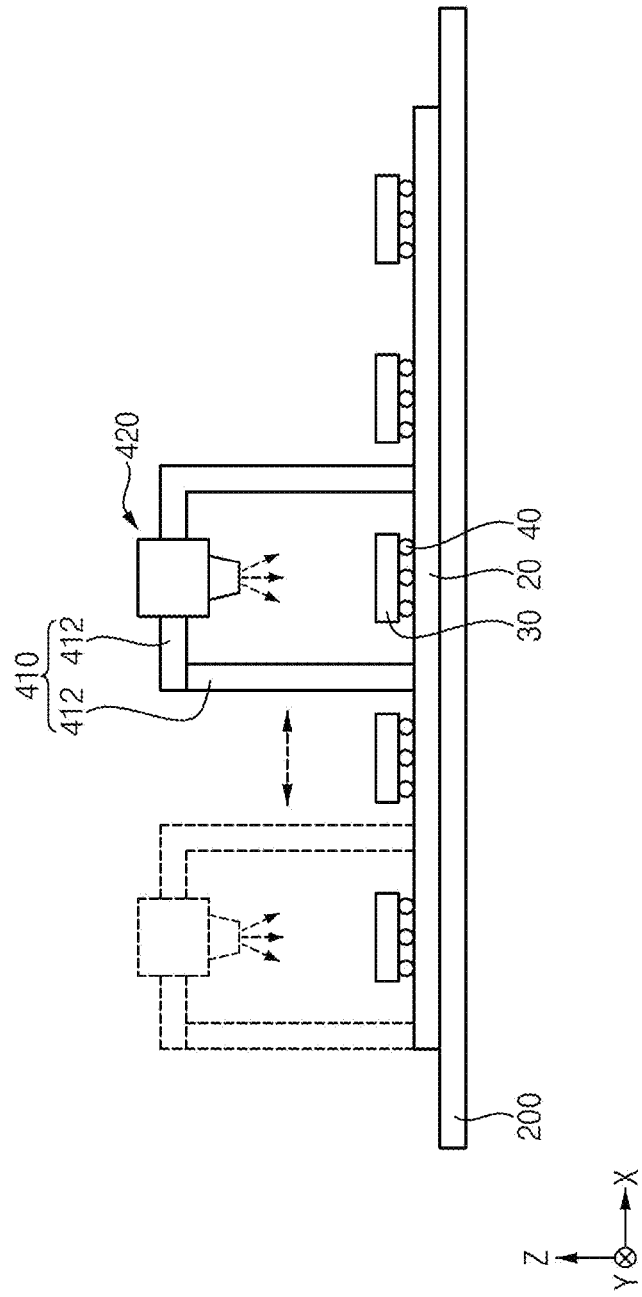

FIG. 7 is a cross-sectional view illustrating a cleaning portion of a solder reflow apparatus in accordance with example embodiments.

Referring to FIG. 7, a fluid shielding cover 410 of a cleaning portion 400 may cover only some of first electronic components 30 on the substrate 20.

In example embodiments, the fluid shielding cover 410 may cover only one electronic component 30 on the substrate 20. In some embodiments, the fluid shielding cover 410 may cover the electronic components 30 arranged in one or more rows on the substrate 20. For example, the fluid shielding cover 410 may cover the electronic components 30 arranged in a row along the Y direction on the substrate 20. A spray nozzle 420 installed within the fluid shielding cover 410 may spray a cleaning fluid F2 onto some electronic components 30 on the substrate 20 within the fluid shielding cover 410.

Additionally, the fluid shielding cover 410 may be installed in an upper portion of a vapor generating chamber 100 to be movable in a horizontal direction (e.g., X direction). The fluid shielding cover 410 may be provided to be movable in the horizontal direction by a transfer mechanism such as a guide rail or a transfer screw installed on an upper wall of the vapor generating chamber 100. As the fluid shielding cover 410 moves in the horizontal direction, the spray nozzle 420 installed within the fluid shielding cover 410 may also move in the horizontal direction.

An appearance inspection device such as a camera portion may be installed within the vapor generating chamber 100 to detect defects such as stains ST on a surface of the soldered article S. When the appearance inspection device identifies positions of some electronic components 30 in which defects have been detected among the electronic components 30 on the substrate 20, the fluid shielding cover 410 may move over to the defect location, and the spray nozzle 420 may spray the cleaning fluid F2 onto the identified defective electronic components 30 on the substrate 20.

Hereinafter, a method of manufacturing an electronic device using the solder reflow apparatus of FIG. 1 will be described. A case in which the electronic device is a semiconductor package will be described. However, it will be understood that the manufacturing method of the electronic device in accordance with example embodiments is not necessarily limited thereto.

Figure 8:
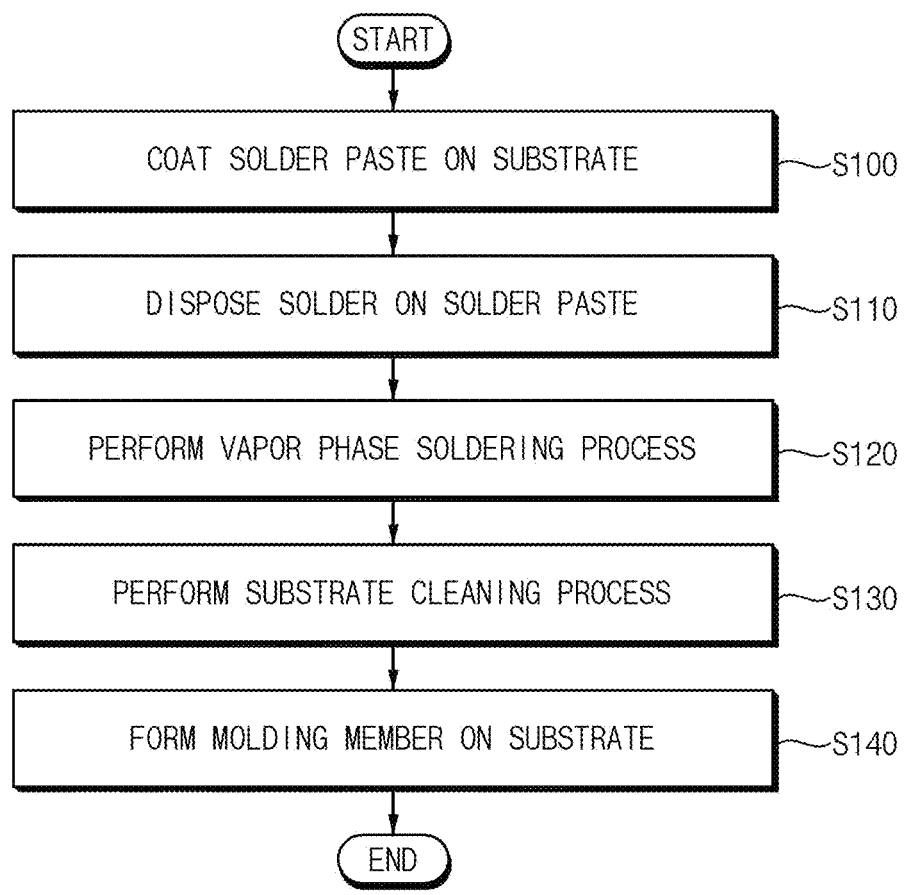
Figure 9:
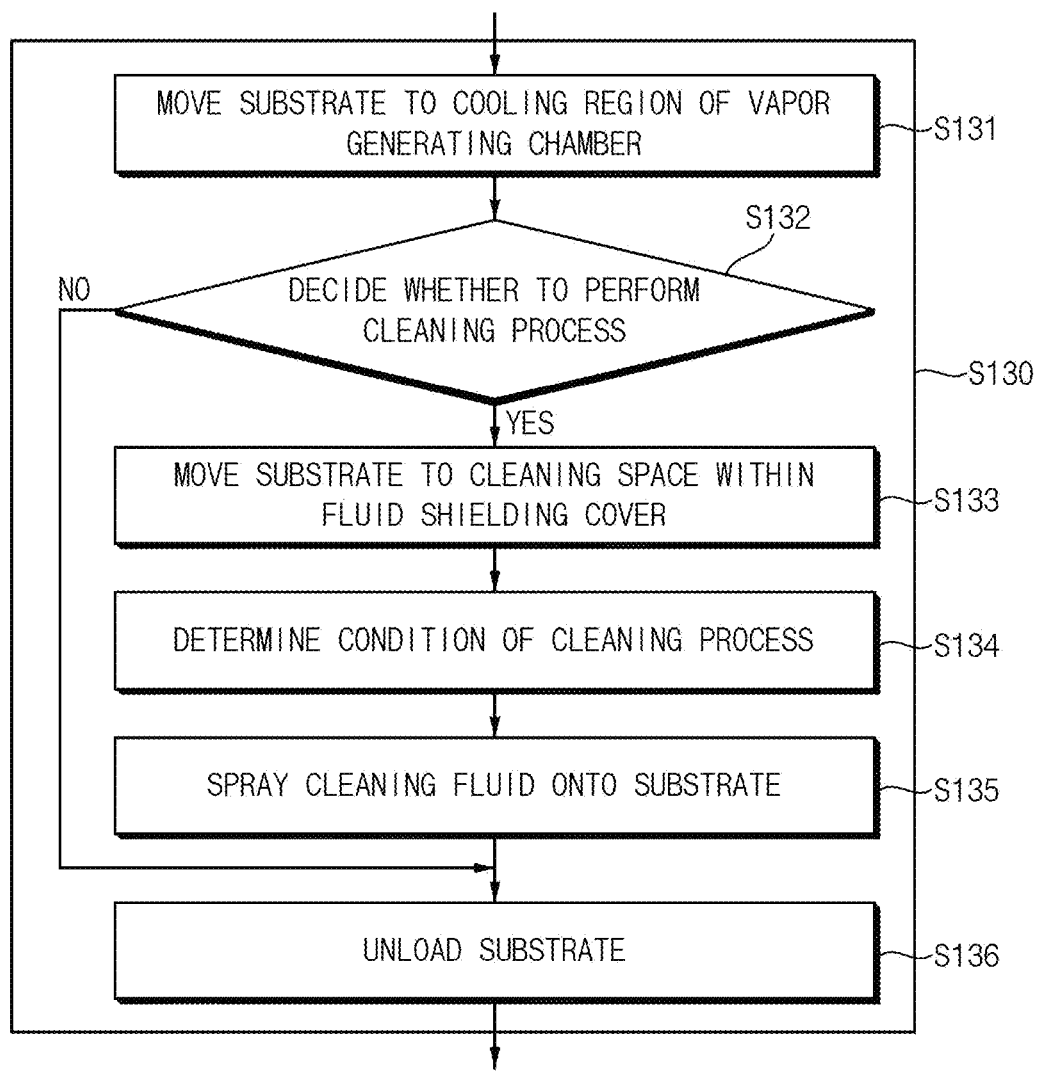
Figure 10:
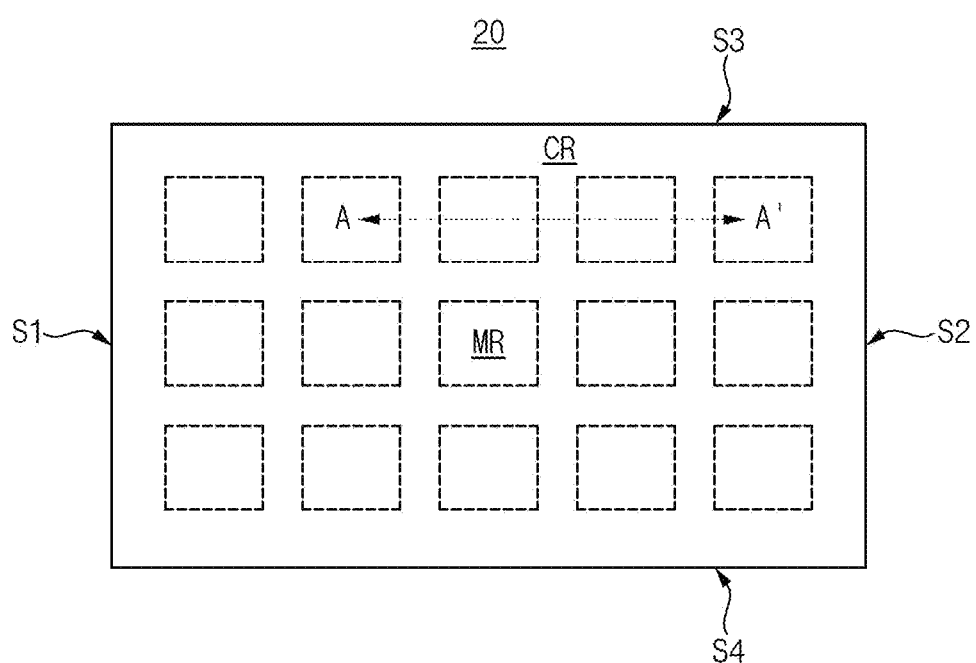
Figure 11:
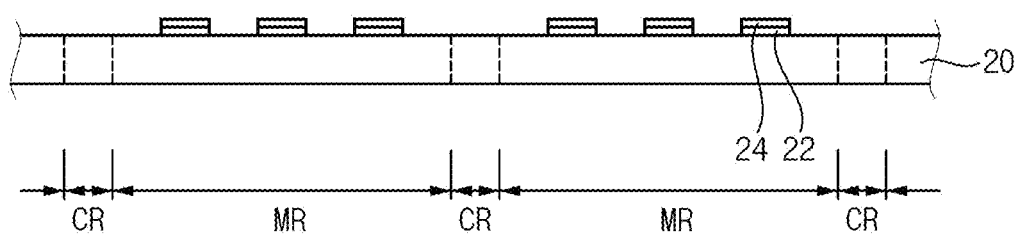

FIG. 8 is a flowchart illustrating a method of manufacturing an electronic device in accordance with example embodiments. FIG. 9 is a flowchart illustrating detailed steps of a substrate cleaning process of FIG. 8. FIGS. 10 to 17 are views illustrating a method of manufacturing an electronic device in accordance with example embodiments. FIG. 10 is a plan view illustrating a strip substrate on which semiconductor chips are mounted. FIGS. 11 and 13 are cross-sectional views taken along the line A-A' in FIG. 10.

Referring to FIGS. 8, 10 and 11, first, a substrate 20 having a plurality of substrate pads 22 formed thereon may be provided, a solder paste 24 may be coated on the plurality of substrate pads 22 of the substrate 20 (S100), and a solder 40 may be disposed on the solder paste 24 (S110).

As illustrated in FIG. 10, the substrate 20 may be a multilayer circuit board as a package substrate having an upper surface and a lower surface opposite to each other. The substrate 20 may be a strip substrate for manufacturing a semiconductor strip such as a printed circuit board (PCB). In some embodiments, the substrate 20 may be a semiconductor chip, an interposer, etc.

The substrate 20 may have first and second side portions S1 and S2 extending in a direction parallel to a second direction perpendicular to the upper surface and facing each other, and third and fourth side portions S3 and S4 extending in a direction parallel to a first direction perpendicular to the second direction and facing each other. In a plan view, the substrate 20 may have a quadrangular shape. The substrate 20 may have a predetermined area. For example, the predetermined area may be, e.g., eg, 77.5 mm×240 mm.

The substrate 20 may include a mounting region MR on which at least one electronic component 30 such as a semiconductor chip is mounted and a cutting region CR surrounding the mounting region MR. A plurality of the mounting regions MR may be arranged in a matrix form on the substrate 20. For example, tens to hundreds of the mounting regions MR may be arranged in a matrix on the substrate 20. As will be described later, a plurality of semiconductor chips may be disposed on the mounting regions MR of the substrate 20, respectively. The semiconductor chips may be mounted on a first surface of the substrate 20 by a flip chip bonding method. For example, the semiconductor chip may include a logic semiconductor device and a memory device. The logic semiconductor device may be an ASIC as a host, such as a CPU, GPU, or SoC. The memory device may include a high bandwidth memory (HBM) device. In some embodiments, the electronic component 30 may include passive elements such as capacitors.

As illustrated in FIG. 11, the solder paste 24 may be coated on each of the plurality of substrate pads 22 of the substrate 20. A pitch between the substrate pads 22 of the substrate 20 may be within a range of several tens of microns.

The solder paste 24 may be printed onto the substrate pads 22 of substrate 20. For example, the solder paste 24 may be printed by a stencil printer. A stencil may be a metal foil having a plurality of openings corresponding to an array of solders that are subsequently placed. During printing, the solder paste 24 may be printed to fill the openings of the stencil. The solder paste 24 may include solder power and flux. The flux may include resin, solvent, activator, antioxidant, etc.

In some embodiments, the solder paste 24 may be coated to a surface of a solder 40 formed on the semiconductor chip.

Figure 12:
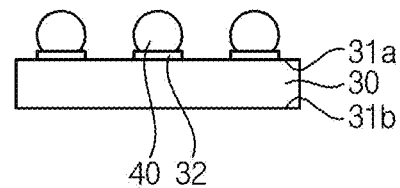
Figure 13:
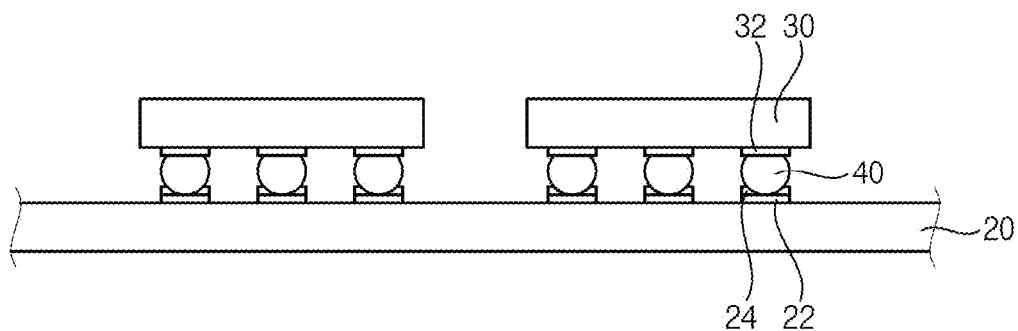

As illustrated in FIG. 12, the solder 40 may be formed on the electronic component 30 mounted on the substrate 20. The electronic component 30 may be a semiconductor chip. In some embodiments, the electronic component 30 may be a semiconductor package. In this case, the substrate 20 may be a module board.

A plurality of input/output pads 32 may be formed on a first surface 31a of the electronic component 30. The solders 40 may be respectively formed on the input/output pads 32. After forming an under bump metal (UBM) on the input/output pad 32, the solder 40 may be formed on the under bump metal.

As illustrated in FIG. 13, the electronic component 30 may be disposed on the substrate 20 such that the solder 40 is interposed between the input/output pad 32 of the electronic component 30 and the solder paste 24. The semiconductor chips may be mounted on the substrate 20 by a flip chip bonding method.

Then, a vapor phase reflow soldering may be performed (S120).

Referring to FIG. 14, the substrate 20 on which the electronic component 30 is mounted may be loaded into the vapor generating chamber 100 of the solder reflow apparatus 10 of FIG. 1, and the substrate 20 may move vertically downward within the vapor generating chamber 100 and the heat transfer fluid F1 in a vapor state may be brought into contact with the surface of the substrate 20 to heat the solder paste 24, thereby reflowing the solder 40. Thus, a solder bump 40 may be formed between the substrate pad 22 and the input/output pad 32.

In example embodiments, after the article S for soldering is be loaded onto the substrate stage 200 in the vapor generating chamber 100, and the Galden solution F may be heated by the heater 110 and start to boil. The saturated vapor from the Galden solution may be distributed within the space 101 of the vapor generating chamber 100. At this time, the density of the saturated vapor may vary depending on the height, and thus a temperature gradient may be formed.

After the article S is preheated in the third zone Z3, the transfer arm 310 may rotate downward so that the article S moves to the second zone Z2 and is activated (soaked). Then, as the transfer arm 310 rotates further downward, the article S may be moved to the first zone Z1 so that the solder 40 may be reflowed. When the article S is immersed in the vapor in the first zone Z1, the vapor may serve as a heat transfer medium. Since the temperature of the vapor and the temperature of the substrate 20 in the first zone Z1 are different from each other, vapor may condense on a surface of the article S to form a layer. The vapor condensing on the surface may transfer latent heat to the surface of the substrate 20 during condensation to reflow the solder 40.

Then, after the solder 40 is soldered, the transfer arm 310 may rotate upward, moving the article S to the second zone Z2 and the third zone Z3, where it undergoes a cooling process. Accordingly, the solder joints may cool down and solidify. At this time, stains ST may form on the surface of the substrate 20 or the electronic component 30 on the substrate 20 due to the condensation of the heat transfer fluid F1.

Then, to remove these stains ST, a substrate cleaning process may be performed (S130).

Referring to FIGS. 9 and 15, after the solder 40 is soldered, the article S may be move through the second zone Z2 in the vapor generating chamber 100 to the third zone Z3, which is a cooling region (S131), and an appearance inspection device including a camera portion may detect defects such as stains ST on the surface of the soldered article S on the substrate stage 200. Based on the defect detection results, it may be determined whether to perform the substrate cleaning process (S132).

When it is determined that the substrate cleaning processing is required to be performed, the transfer arm 310 may further rotate upward to move the article S into the cleaning space 411 of the cleaning portion 400 installed within the third zone Z3 within the vapor generating chamber 100 (S133). The cleaning portion 400 may determine conditions for the substrate cleaning process based on the defect detection result (S134). The conditions of the substrate cleaning process may include a supply flow rate of a cleaning fluid F2, temperature of the cleaning fluid F2, an injection position of the spray nozzle 420, an injection speed, an injection time, a supply flow rate of a drying gas G, a supply time of the drying gas G, etc.

Then, as illustrated in FIG. 15, the spray nozzle 420 may spray the cleaning fluid F2 on the surface of the substrate 20 or the electronic component 30 on the substrate 20 to remove the stains ST generated by the condensation of the heat transfer fluid F1 (S135).

Accordingly, after the solder reflow process, the article S may be immediately transferred to a molding apparatus for a molding process without the need to perform a cleaning process in a separate space.

Figure 16:
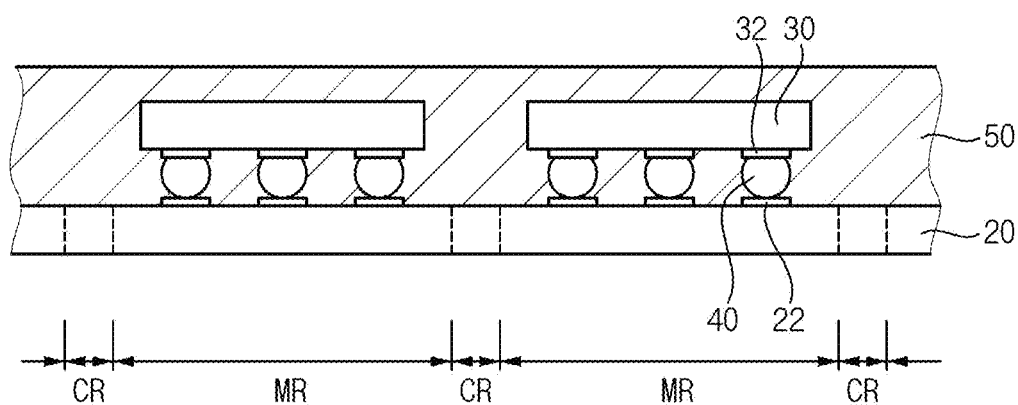

Referring to FIG. 16, a molding member 50 may be formed on the substrate 20 to cover the semiconductor chips 30 (S140).

In example embodiments, the molding member 50 may be formed on the substrate 20 by a transfer molding apparatus. The substrate 20 may be disposed in a molding space of a mold of the molding apparatus, and a sealing material may flow at high temperature and under high pressure when a lower mold and an upper mold are clamped, so that the liquid sealing material flows inside the molding space and is solidified to form the molding member 50 covering the semiconductor chips 30. For example, the liquid sealing material may include an epoxy mold compound (EMC).

Figure 17:
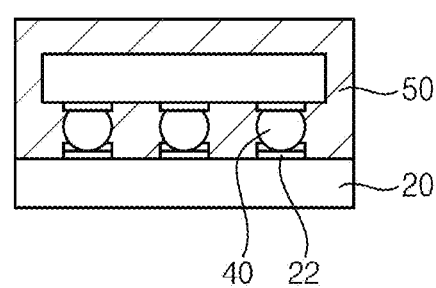

Referring to FIG. 17, the substrate 20 may be sawed by a sawing process to complete semiconductor packages 60.

In example embodiments, external connection members such as solder balls may be formed on outer connection pads on a lower surface of the substrate 20, and the cutting region CR of the substrate 20 may be removed by a cutting device such as a blade. Accordingly, the semiconductor packages P may be individualized from the substrate 20.

Through the above processes, a semiconductor package including a logic device or a memory device and a semiconductor module including the same may be manufactured. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings of the present invention. Accordingly, all such modifications are intended to be included within the scope of example embodiments as set forth by the claims.

What is claimed is:

1. A solder reflow apparatus, comprising:
   a vapor generating chamber configured to accommodate a heat transfer fluid and to be filled with saturated vapor generated when the heat transfer fluid is heated;
   a heater configured to heat the heat transfer fluid within the vapor generating chamber;
   a substrate stage configured to move up and down within the vapor generating chamber and configured to support a substrate on which an electronic component is mounted via solders; and
   a cleaning portion disposed in a cooling region of the vapor generating chamber,
   wherein the cleaning portion includes a fluid shielding cover that is configured to cover the substrate on the substrate stage when the substrate stage is in the cooling region to form a cleaning space, and a spray nozzle configured to spray a cleaning fluid onto the substrate in the cleaning space.

2. The solder reflow apparatus of claim 1, wherein the cleaning portion further includes:
   a fluid passage extending to the vapor generating chamber, connecting with the spray nozzle and through which the cleaning fluid flows; and
   a fluid supply connected to the fluid passage to supply the cleaning fluid to the fluid passage.

3. The solder reflow apparatus of claim 2, wherein the cleaning portion further includes:
   a gas supply connected to the fluid passage and configured to supply a gas into the cleaning space for drying the cleaning fluid in the cleaning space.

4. The solder reflow apparatus of claim 3, wherein the cleaning portion further includes:
   a gas exhaust portion configured to collect the gas supplied into the cleaning space and to discharge the gas from the vapor generating chamber to the outside of the vapor generating chamber.

5. The solder reflow apparatus of claim 2, wherein the cleaning portion further includes:
   a second heater configured to heat the cleaning fluid in a storage tank of the fluid supply.

6. The solder reflow apparatus of claim 1, wherein the spray nozzle is movable in a horizontal direction in the fluid shielding cover.

7. The solder reflow apparatus of claim 1, wherein the fluid shielding cover includes:
   an upper shielding portion extending in a horizontal direction to cover the substrate; and
   a vertical shielding portion extending in a vertical direction from the upper shielding portion to form the cleaning space.

8. The solder reflow apparatus of claim 1, further comprising:
   a guide structure configured to collect the cleaning fluid sprayed onto the substrate on the substrate stage that is in the cooling region and to direct the cleaning fluid to a reservoir that contains the heat transfer fluid.

9. The solder reflow apparatus of claim 1, wherein the cleaning fluid includes a fluid the same as the heat transfer fluid.

10. The solder reflow apparatus of claim 9, wherein the cleaning fluid includes a Galden solution.

11. A solder reflow apparatus comprising:
- a vapor generating chamber configured to accommodate a heat transfer fluid and to be filled with saturated vapor generated when the heat transfer fluid is heated;
- a heater configured to heat the heat transfer fluid to generate saturated vapor;
- a substrate stage configured to be moved up and down within the vapor generating chamber and configured to support a substrate on which an electronic component is mounted via solder;
- a cleaning portion installed in an upper portion of the vapor generating chamber, wherein the cleaning portion is configured to spray a cleaning fluid onto the substrate on the substrate stage, wherein the cleaning fluid includes a material the same as the heat transfer fluid; and
- a guide structure configured to collect the cleaning fluid sprayed onto the substrate on the substrate stage and to direct the cleaning fluid to a reservoir that contains the heat transfer fluid.

12. The solder reflow apparatus of claim 11, wherein the cleaning portion includes:
- a fluid shielding cover configured to cover the substrate on the substrate stage that is in the upper portion of the vapor generating chamber to form a cleaning space; and
- a spray nozzle configured to spray the cleaning fluid onto the substrate within the cleaning space.

13. The solder reflow apparatus of claim 12, wherein the cleaning portion further includes:
- a fluid passage extending within the vapor generating chamber, connected to the spray nozzle and through which the cleaning fluid flows; and
- a fluid supply connected to the fluid passage to supply the cleaning fluid to the fluid passage.

14. The solder reflow apparatus of claim 13, wherein the cleaning portion further includes:
- a gas supply connected to the fluid passage, and configured to supply a gas into the cleaning space for drying the cleaning fluid in the cleaning space.

15. The solder reflow apparatus of claim 14, wherein the cleaning portion further includes:
- a gas exhaust portion configured to collect the gas supplied into the cleaning space and to discharge the gas from the vapor generating chamber to the outside of the vapor generating chamber.

16. The solder reflow apparatus of claim 13, wherein the cleaning portion further includes:
- a second heater configured to heat the cleaning fluid in a storage tank of the fluid supply to a preset temperature range.

17. The solder reflow apparatus of claim 12, wherein the spray nozzle is movable in a horizontal direction in the fluid shielding cover.

18. The solder reflow apparatus of claim 12, wherein the fluid shielding cover includes:
- an upper shielding portion extending in a horizontal direction to cover the substrate; and
- a vertical shielding portion extending in a vertical direction from the upper shielding portion to form the cleaning space.

19. The solder reflow apparatus of claim 18, wherein the upper shielding portion includes a contact portion that makes contact with at least a portion of an upper surface of the substrate when the substrate stage is raised and positioned within the cleaning space of the fluid shielding cover, and
- wherein the upper shielding portion is spaced apart from the upper surface of the substrate to form an outlet portion where the cleaning fluid sprayed on the substrate flows out to the guide structure.

20. A solder reflow apparatus, comprising:
- a vapor generating chamber configured to accommodate a heat transfer fluid and to be filled with saturated vapor generated when the heat transfer fluid is heated;
- a heater configured to heat the heat transfer fluid;
- a substrate stage configured to be moved up and down within the vapor generating chamber and configured to support a substrate on which an electronic component is mounted via solders;
- a fluid shielding cover provided in a cooling region of the vapor generating chamber, wherein the fluid shielding cover includes an upper shielding portion extending in a horizontal direction to cover the substrate on the substrate stage in the cooling region and a vertical shielding portion extending in a vertical direction from the upper shielding portion to form a cleaning space; and
- a spray nozzle configured to spray a cleaning fluid onto the substrate within the cleaning space.

* * * * *